United States Patent [19]
Zinger et al.

[11] Patent Number: 5,768,125
[45] Date of Patent: Jun. 16, 1998

[54] APPARATUS FOR TRANSFERRING A SUBSTANTIALLY CIRCULAR ARTICLE

[75] Inventors: Jan Zinger, Dwingeloo; Kornelius Haanstra, Nijeveen; Rudi Schimmel, Cuyk, all of Netherlands

[73] Assignee: ASM International N.V., Bilthoven, Netherlands

[21] Appl. No.: 569,303

[22] Filed: Dec. 8, 1995

[51] Int. Cl.$^6$ .................. B65G 1/00; G01V 8/00
[52] U.S. Cl. .................. 364/167.01; 364/478.01; 364/478.05; 414/274; 414/275; 414/276; 414/277; 414/284
[58] Field of Search .................. 364/167.01, 478.02, 364/478.03, 478.04, 478.05, 478.06; 414/217, 222, 225, 236, 737, 786, 273, 274, 275, 276, 277, 278, 279, 280, 281, 282, 283, 284, 285, 286

[56] References Cited

U.S. PATENT DOCUMENTS

| | | | |
|---|---|---|---|
| 4,744,713 | 5/1988 | Hrovath | 414/222 |
| 4,836,733 | 6/1989 | Hertel et al. | 414/255 |
| 5,239,182 | 8/1993 | Tateyama et al. | 250/561 |
| 5,483,138 | 1/1996 | Shmookler et al. | 318/568.16 |

*Primary Examiner*—Emanuel T. Voeltz
*Assistant Examiner*—Demetra R. Smith
*Attorney, Agent, or Firm*—Young & Thompson

[57] ABSTRACT

An apparatus for transferring a substantially circular article from a first unloading position to a second loading position compensates for misalignment of the article on a support arm. During movement of the support arm the periphery of the circular article is detected, and a correction of the movement of the support arm is generated.

12 Claims, 4 Drawing Sheets

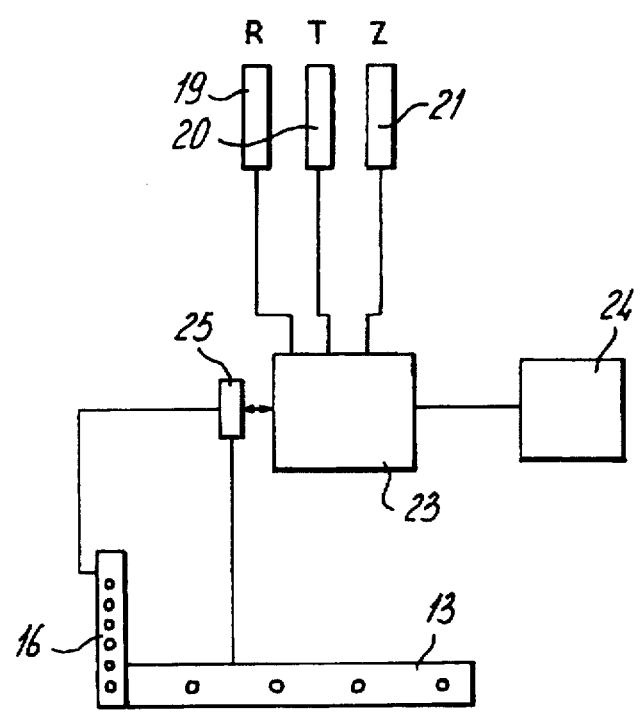

APPARATUS FOR TRANSFERRING A SUBSTANTIALLY CIRCULAR ARTICLE

BACKGROUND OF THE INVENTION

During wafer processing in a reactor wafers are transferred from a processing station or feed station to a (further) processing station or discharge station. At this end a transferring apparatus is used.

U.S. Pat. No. 5,407,449 describes an apparatus being able to pick-up wafers from one station and to transfer them to another station. This apparatus is adjustable in vertical direction to be able to transfer wafers from a stack from one station to another. The transferring apparatus comprises an arm having three arms portions of which one portion is the support portion on which the wafer is loaded.

During loading, unloading and processing wafers will slightly move from their starting position. If no correction is effected this deviation from the original position will be transferred in the next stage, i.e. this deviation will also be present in a next station.

If several processing steps are undertaken this will mean that at the end of a series of processing steps a stack of wafers comprises a number of wafers having different positions. Because some processes are very critical with regard to the position of the wafer this is highly undesirable.

To prevent misalignment of the wafer with regard to the supporting arm portion it has been proposed to provide video cameras above or in the apparatus for transferring the wafers in order to obtain a correction. Such cameras are relatively complicated with regard to recognizing the wafers and determining the correction desired. Furthermore a reliable determination of the position of the several components can be made only if there is no movement of the arm.

instead of cameras it is also proposed to use a sensor array at the top of the system. Also this system functions best if the wafer is in a stationary position.

SUMMARY OF THE INVENTION

The invention aims to determine the position of the wafer with regard to the supporting arm position in a dynamic way i.e. during movement of the transfer robot to keep the time for transferral as short as possible. The invention furthermore aims to simplify the method for determining the position of the wafer on the supporting arm portion.

Furthermore the invention aims to obtain a correction for deviations in speed of the several arm portions of the arm of the apparatus for transfering the wafer.

The invention aims to provide a system for determing the position of the wafer with regard to the supporting arm position which is independent from the position of the supporting arm portion in a vertical direction.

This is realized with an apparatus for transferring a substantially circular article from a first unloading position to a second loading position, comprising displaceable transferring means for engaging said article, transferring it and discharging it in said second position, means for determining the position of said article on said displaceable transferring means, position control means for controlling movement of said displaceable transferring means, said position control means comprising an array of fixed light sensitive means positioned in the path of the article between said first and said second positions in a direction not parallel with the extension of said path and wherein calculating means are provided for determining the position of said article based on the output of said array light sensitive means and the speed of said displaceable transferring means and which is connected to said position control means.

According to a preferred embodiment the invention relates to an apparatus for transferring a substantially circular article from a first unloading position to a second loading position, comprising displaceable transferring means for engaging said article, transferring it and discharging it in said second position, means for determining the position of said article on said displaceable means, position control means for controlling movement of said displaceable transferring means, said position control means comprising an array of fixed light sensitive means positioned in the path of the article between said first and said second positions in a direction not parallel with the extension of said path and wherein calculating means are provided for determining the position of said article based on the output of said array light sensitive means and the speed of said displaceable transferring means and being connected to said controlling means, and having further light sensitive means for determining the speed of said article during passage of said array of light sensitive means and which is connected to calculating means.

DETAILED DESCRIPTION OF THE INVENTION

The invention will be further elucidated referring to the drawings, in which:

FIG. 5 shows a block diagram.

Figure 1:
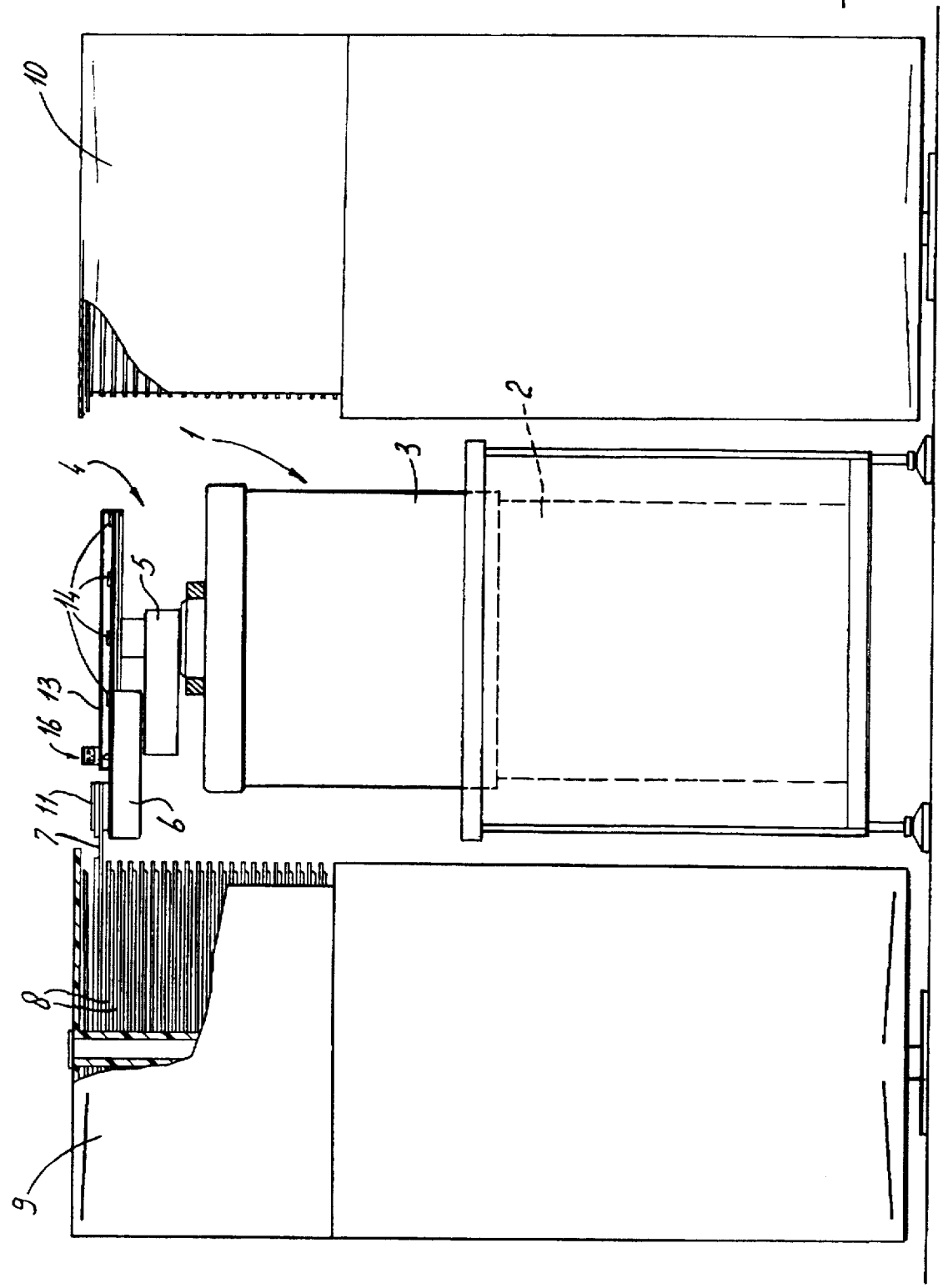
FIG. 1 shows a side elevation of the device according to the invention.

In FIG. 1 a robot 1 is shown comprising a lower fixed part 2 and an upper part 3. Upper part 3 can be moved with regard to lower fixed part 2 in a vertical direction by telescoping means which are not further shown. On upper part 3 an arm 4 is provided comprising a first, second and third support arm portions indicated by 5, 6, 7 respectively. Support arm portion 7 is embodied to receive a wafer 8. Wafer 8 has to be transferred from storage 9 to storage 10.

Figure 2:
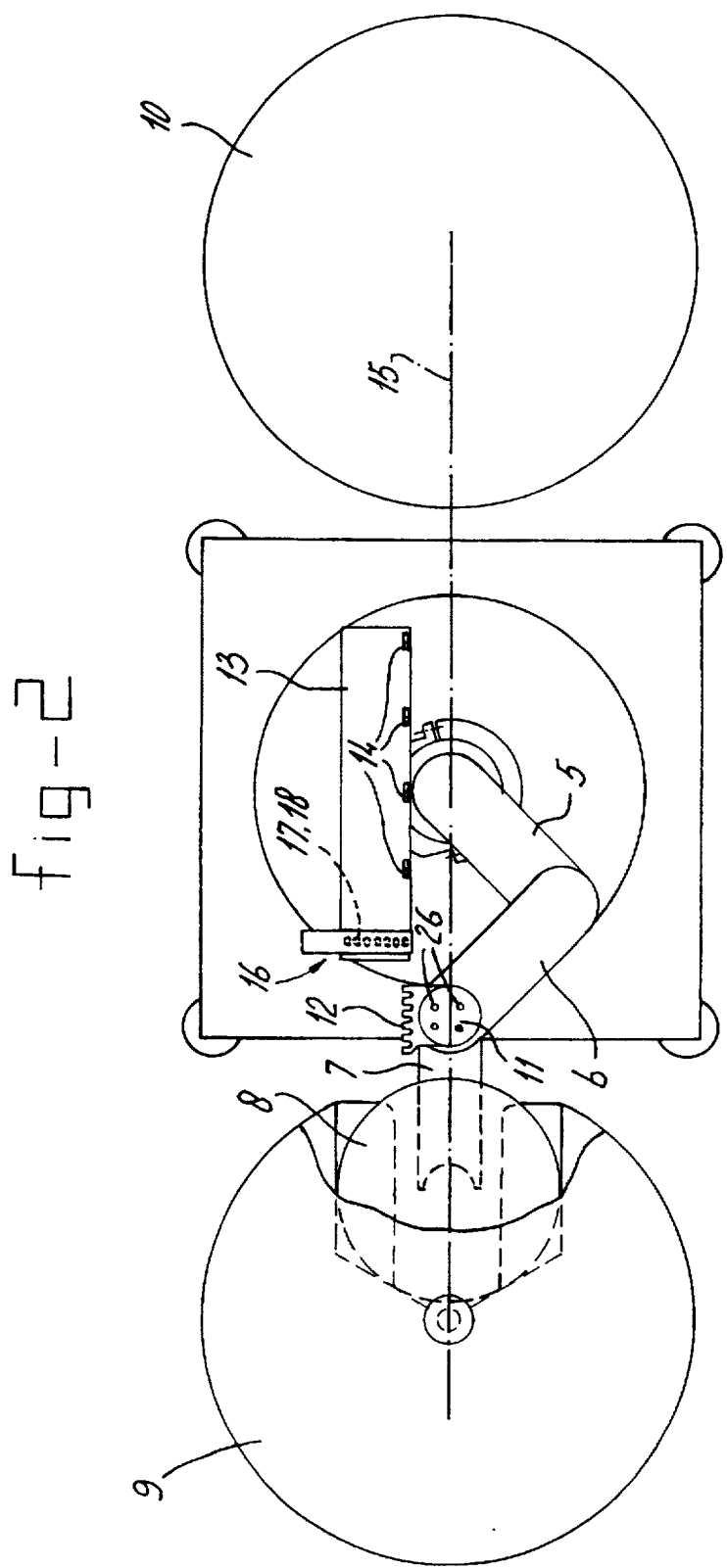
FIG. 2 shows a plan view of the device according to FIG. 1.

As shown in FIG. 2, supporting arm portion 7 is provided with a vacuum suction supporting face 26. With this vacuum suction support 26 it is possible to lock the water to the supporting arm portion during transversal and to release it at unloading.

Storages 9 and 10 can e.g. be processing stations of a device for treating micro circuit wafers. Reference is made to U.S. Pat. No. 5,407,449 which is incorporated by reference and wherein a robot is shown transferring wafers from one station to another.

Arm portion 7 is provided with comb reference means 11. These reference means are provided with a serrated extremity indicated by 12.

Upper part 3 is provided with an elongated member 13 in which a number of light reflective sensors 14 are provided.

Operation of first arm portion 5, second arm portion 6 and support arm portion 7 is such that the center of support arm portion 7 will follow dashed line 15. This means that the serrated extremity 12 will move over light sensitive diodes 14.

Figure 3:
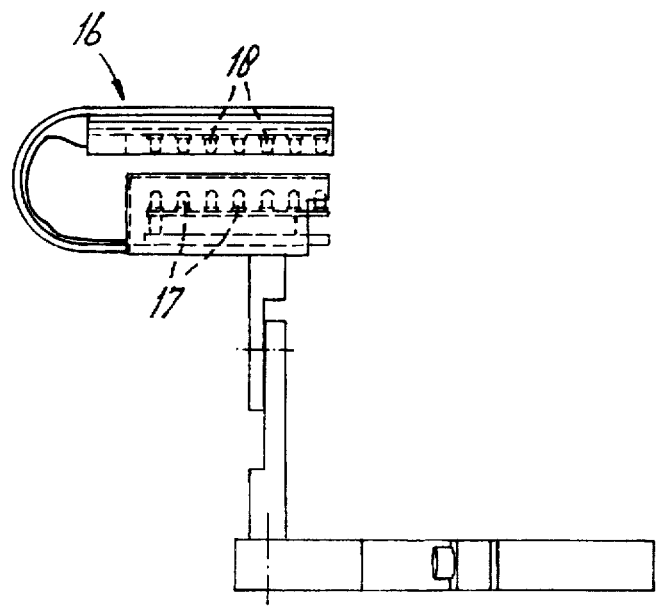
FIG. 3 shows a detail in side view and partially exploded of a device according to the invention.
Figure 4:
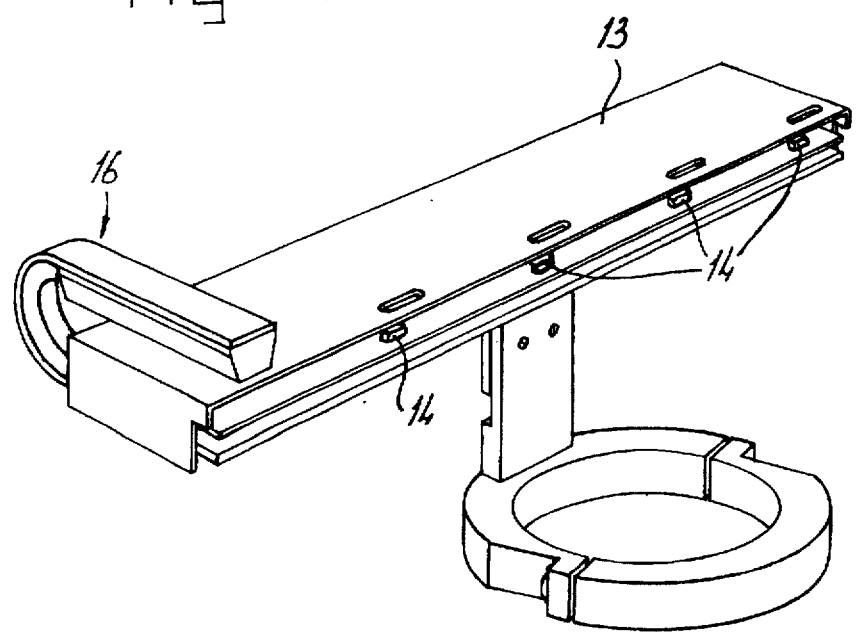
FIG. 4 shows a perspective view of the device according to FIGS. 1–3 incl.

On elongated member 13 a U-shaped member 16 is provided which is shown more in detail in FIG. 3.

In this member opposed sets of light emitting and light sensitive diodes 17 respectively 18 are provided. The gap between the logs of the U-shaped member 16 are sized as to receive wafer 8 therebetween during its movement along dashed line 15 without contacting the upper and the lower legs of U-shaped member 16.

For operating arm 4 three motors 19, 20 and 21 (for R, T and Z direction respectively) are provided as is schematically shown in FIG. 5. Operation of the several motors is through control means 23. Control means 23 receive input from a main processing unit 24 controlling the sequence of discharging, charging of storages 9, 10 respectively.

The signal from array of light sensitive means 17, 18 is input in calculating means 25. The same is true for the signal obtained from the light sensitive diodes 14. From this calculating means a correction signal is introduced in control 23.

The device described above functions as follows. During movement of a wafer from the position shown in FIG. 2 along dash line 15 the serrated extremity 12 of reference means 11 will pass one of the light sensitive means of U-shaped member 16 (the most right one in FIG. 3) and the light sensitive diodes 14 on elongated member 13. Based on the signals from these diodes the calculating means 25 are able to calculate the speed of serrated extremities 12 and from this the speed of support arm portion 7.

At the same time wafer 8 will move between the legs of U-shaped member 16. One or more of the light emitting diode/light sensitive diodes 17, 18 respectively will subsequently from the right to the left be activated, deactivated respectively.

From this array of light sensitive diodes information can be obtained the position of wafer 8 an support arm portion 7 in the direction of dashed line 15 as well as its position perpendicular thereto. This is calculated based on the output of the signal of U-shaped member 16 input to calculating means 25.

Through the provision of e.g. six dents of the serrated extremity 12 in combination with four sensors 14 it is possible to affect 48 measures for returning the speed of supporting arm portion 7. Knowing the speed is of importance for determining the shape of the circle of article 8.

Based on the speed of support arm portion 7 and the position of wafer 8 on support arm portion 7 it is possible to provide a correction signal to control means 23 to correct the position of support arm portion 7 by adjusting the control of the two motors 19, 21.

Although the invention has been described above relating to a preferred embodiment it has been understood that many variations can be introduced without leaving the scope of protection and being obvious for the person skilled in the art.

For example it is possible to omit measure of the speed of support arm portion 7 and calculate this speed based on the rotation of the several motors 19-21.

Except from using all light emitting diodes and light sensitive diodes 17, 18 for determining the position of wafer 8 it in also possible to only use for example the first and last set of calculating and to use the other one as a check.

We claim:

1. An apparatus for transferring a substantially circular article from a first loading position to a second unloading position, the apparatus comprising:

displaceable transferring means for engaging the article at the first position, transferring it substantially horizontally along a linear path, and discharging it at the second position;

means for determining a horizontal position of the article relative to said displaceable transferring means while the article is engaged by said displaceable transferring means and is being transferred along said linear path, said means for determining comprising a first generally linear array of light sensors in said linear path between the first and second positions in a direction not parallel to said linear path, and calculating means for determining the horizontal position of the article relative to said displaceable transferring means based on an output from said first array; and position control means connected to said calculating means for controlling movement of said displaceable transferring means.

2. The apparatus of claim 1, further comprising a U-shaped support member with two spaced-apart legs for passage of the article therethrough when the article is being transferred along said linear path, said two legs supporting said array of light sensors so that said array is disposed on both sides of the article during the article's passage through said legs.

3. An apparatus for transferring a substantially circular article from a first loading position to a second unloading position, the apparatus comprising:

displaceable transferring means for engaging the article at the first position, transferring it substantially horizontally along a linear path, and discharging it at the second position;

speed determining means for determining a speed of the article while the article is engaged by said displaceable transferring means and is being transferred along said linear path, said speed determining means comprising a first generally linear array of light sensors in said linear path between the first and second positions in a direction not parallel to said linear path and a multi-pronged reference on said displaceable transferring means, each prong of said multi-pronged reference for being detected by a light sensor in said first array during passage of the article along said linear path, and calculating means for determining the speed of the article based on an output from said first array; and position control means connected to said calculating means for controlling movement of said displaceable transferring means.

4. The apparatus of claim 3, wherein said speed determining means further comprises a second generally linear array of light sensors parallel to said linear path for detecting passage of each prong in said multi-pronged reference and for indicating the detected passages to said calculating means.

5. An apparatus for transferring a substantially circular article at least substantial horizontal from a first unloading position to a second loading position, comprising:

displaceable transferring means for engaging said article, transferring it in a linear path and discharging it in said second position;

means for determining the substantial horizontal position of said article relative to said displaceable transferring means;

position control means for controlling movement of said displaceable transferring means;

said means for determining the substantial horizontal position of said article comprising an array of light sensitive means positioned in said path of the article between said first and said second positions in a direction not parallel with said path;

said transferring means being arranged such that said article is moved along said path along said array of light sensitive means; and calculating means for determining the position of said article relative to said transferring means based on the output of said array of light sensitive means and the linear speed of said transferring means along said linear path and which is connected to said position control means.

6. An apparatus according to claim 5, further comprising means for determining speed of said article during passage through said array of light sensitive means, wherein said speed determining means are connected to the calculating means.

7. An apparatus according to claim 6, wherein said speed determining means comprise further light sensitive means and cooperating reference means on said transferring means.

8. An apparatus according to claim 5, wherein a support arm portion of said transferring means is provided with reference means cooperating with further light sensitive means, said further light sensitive means being connected to speed determining means which are connected to the calculating means.

9. An apparatus according to claim 5, wherein said array of light sensitive means extends substantially perpendicular to said linear path.

10. An apparatus for transferring a substantially circular article at least substantial horizontal from a first unloading position to a second loading position, comprising:

displaceable transferring means for engaging said article, transferring it in a linear path and discharging it in said second position;

means for determining the substantial horizontal position of said article on said displaceable transferring means;

position control means for controlling movement of said displaceable transferring means;

said means for determining the substantial horizontal position of said article comprising an array of light sensitive means positioned in said path of the article from said first to said second position in a direction not parallel with said path;

said transferring means being arranged such that said article is moved along said linear path along said array of light sensitive means;

calculating means for determining the position of said article relative to said transferring means based on the output of said array light sensitive means and the linear speed of said transferring means along said linear path and which is connected to said position control means; and further light sensitive means for determining the linear speed of said article during passage of said array of light sensitive means which is connected to said calculating means.

11. An apparatus according to claim 10, wherein said further light sensitive means comprise a further array of spaced light sensitive means.

12. An apparatus according to claim 11, wherein both arrays of light sensitive means have at least one common light sensitive means.

* * * * *